US009478330B2

(12) United States Patent
Parola et al.

(10) Patent No.: US 9,478,330 B2
(45) Date of Patent: Oct. 25, 2016

(54) CONTROL DEVICE FOR AN ELECTRICAL CIRCUIT BUILT ON A SUBSTRATE OF POLYMERIC MATERIAL

(71) Applicant: Plastic Components and Modules Automotive S.p.A, Grugliasco, Turin (IT)

(72) Inventors: Enrico Parola, Turin (IT); Pasquale Iacobone, Potenza (IT); Etienne Valentin, Turin (IT)

(73) Assignee: PLASTIC COMPONENTS AND MODULES AUTOMOTIVE S.p.A., Grugliasco, Turin (IT)

( * ) Notice: Subject to any disclaimer, the term of this patent is extended or adjusted under 35 U.S.C. 154(b) by 397 days.

(21) Appl. No.: 14/105,630

(22) Filed: Dec. 13, 2013

(65) Prior Publication Data

US 2014/0167910 A1 Jun. 19, 2014

(30) Foreign Application Priority Data

Dec. 14, 2012 (IT) .............................. TO2012A1084

(51) Int. Cl.
| H02N 2/00 | (2006.01) |
| G01P 15/12 | (2006.01) |
| G01P 15/08 | (2006.01) |
| H01C 10/10 | (2006.01) |
| H03K 17/96 | (2006.01) |

(52) U.S. Cl.
CPC .......... *H01C 10/106* (2013.01); *H03K 17/964* (2013.01)

(58) Field of Classification Search
USPC ....... 310/328, 330, 338, 339, 363, 365, 800; 73/514.33, 514.35
See application file for complete search history.

(56) References Cited

U.S. PATENT DOCUMENTS

| 6,282,804 B1* | 9/2001 | Jiang .......................... 33/366.21 |
| 8,302,285 B2* | 11/2012 | Sasaki et al. ................... 29/595 |
| 2008/0011058 A1* | 1/2008 | Lal et al. ...................... 73/54.23 |
| 2008/0100176 A1* | 5/2008 | Haskell et al. ........... 310/313 R |

(Continued)

FOREIGN PATENT DOCUMENTS

| DE | 29907054 | 8/2000 |
| EP | 1663720 | 6/2011 |

(Continued)

OTHER PUBLICATIONS

Simon J. Leigh et al: "A Simple, Low-Cost Conductive Composite material for 3D Printing of Electronic Sensors", PLOS One, vol. 7, No. 11, Nov. 21, 2012, p. e49365, XP055088994, DOI: 10.1371/journal.pone.0049365 *the whole document*.

(Continued)

*Primary Examiner* — Thomas Dougherty
(74) *Attorney, Agent, or Firm* — Howard & Howard Attoneys PLLC

(57) ABSTRACT

The present invention concerns a control device for an electrical circuit integrated on a substrate made of polymeric material, incorporating carbonaceous conductive structures which define at least one track having improved electrical conductivity properties with respect to the substrate, which control device includes an operating area adapted to be acted on by a user and having a pressure-deformable structure adapted to disturb the electrical properties of the track by a piezo-resistive effect, wherein the conductive track includes at least one linear segment which has a winding progression at the operating area.

8 Claims, 2 Drawing Sheets

(56) References Cited

U.S. PATENT DOCUMENTS

| | | | |
|---|---|---|---|
| 2010/0140723 A1 | 6/2010 | Kurtz et al. | |
| 2012/0001870 A1 | 1/2012 | Lee et al. | |
| 2012/0313860 A1* | 12/2012 | Hashimura et al. | 345/173 |
| 2013/0275058 A1* | 10/2013 | Awad | 702/42 |

FOREIGN PATENT DOCUMENTS

| | | |
|---|---|---|
| GB | 2141548 A | 12/1984 |
| WO | 2007096016 | 8/2007 |
| WO | 2010026000 | 3/2010 |
| WO | 2012055934 | 5/2012 |
| WO | 2012101374 | 8/2012 |

OTHER PUBLICATIONS

Alamusi et al: "Piesoresistive Strain Sensors Made from Carbon Nanotubes Based Polymer Nanocomposites", Sensors, vol. 11, No. 12, Dec. 11, 2011, pp. 10691-10723, XP055088999, ISSN: 1424-8220, DOI: 10-3390/s111110691 *the whole document*.

Haibo Zhao et al: "Carbon nanotube yarn strain sensors", Nanotechnology, IOP, Bristol, GB, vol. 21, No. 30, Jul. 30, 2010, p. 305502, XP020175140, ISSN: 0957-4484 *the whole document*.

Li et al: "Sensors and Actuators based on carbon nanotubes and their composites: A review", Composites Science and Technology, Elsevier, UK, vol. 68, No. 6, Jan. 26, 2008, pp. 1227-1249, XP022527239, ISSN: 0266-3538, DOI: 10.1016/J.COMPSCITECH.2008.01.006 *paragraph [0006]*.

Eun-Soo Hwang et al: "A Polymer-Based Flexible Tactile Sensor for Both normal and Shear Load Detections and Its Application for Robotics", Journal of Microelectromechanical Systems, IEEE Service Center, US, vol. 16, No. 3, Jun. 1, 2007, pp. 556-563, XP011187750, ISSN:1057-7157, DOI:10.1109/JMEMS.2007.896716 *the whole document*.

Waris Obitayo et al: "A Review: Carbon Nanotube-Based Piezoresistive Strain Sensors", Journal of Sensors, vol. 283, No. 6, Jan. 1, 2012, pp. 62-15, XP055089013, ISSN: 1687-725X, DOI: 10.1166/jnn.2004.109 *The whole document*.

Italian Search Report—IT TO20121084 dated Nov. 19, 2013.

* cited by examiner

CONTROL DEVICE FOR AN ELECTRICAL CIRCUIT BUILT ON A SUBSTRATE OF POLYMERIC MATERIAL

CROSS-REFERENCE TO RELATED APPLICATIONS

This application is based upon and claims priority to Italian Patent Application TO2012A001084 filed on Dec. 14, 2012.

BACKGROUND OF THE INVENTION

1. Field of Invention

The present invention relates to the integration of electrical devices and connections in plastics, and in particular in components or structural parts which are made of polymeric material. More specifically, the invention relates to a control device for an electrical circuit adapted to provide switching functions.

2. Description of Related Art

In the automotive field, it is known to use non-conductive polymeric materials, such as polyolefinic thermoplastic polymers (commercially available as polypropylene (PP) or high-density polyethylene (HDPE)) for the realization of on-board components, such as fuel systems (tanks and other structural parts), internal finishing of the passenger compartment (dashboard, door panels), and external finishing of the vehicle body (bumpers, mouldings).

The on-board electrical or electronic devices that are installed in combination with these components (for example, sensors, devices for operating on-board systems, devices for controlling the management of the functions in the passenger compartment) are typically made as discrete elements housed in seats (obtained by moulding in the shape of the component) and are connected to remote power supply sources and remote signal processing components by wiring laid along the chassis of the vehicle.

In order to avoid laying extensive lengths of wiring, different technological solutions are known in the art for integrating the electrical connection lines in a plastic matrix which forms a lining in the passenger compartment of a vehicle or a structural component of the vehicle. Further, integration of the on-board electronic devices (for example, the devices for controlling the passenger compartment and bodywork functions) in the plastic components inside the passenger compartment (such as the dashboard and the door panels) is known, where the devices may be embedded and touch-operated.

Published international patent application WO 2007/096016 describes a lining for a vehicle in which regions are formed (including switching, sensor, or electrical/electronic signal transmission functions). The on-board functional devices (such as the sensor or control devices) are formed as discrete elements arranged in a mould for forming the lining prior to injection of plastic, so as to surface at the side of the lining facing the passenger compartment once moulding has been performed. The on-board functional devices provide a touch-operation function. Flexible conductor strips are embedded in the plastic matrix during moulding for connecting the devices outside of the formed lining.

Published European patent application EP 1,663,720 describes a touch-operated device that can be used on-board a vehicle, which includes a capacitive sensor arranged underneath a surface of an internal lining of the vehicle that can be touch-operated by a person present inside the passenger compartment. Such a device may be integrated in the covering surface of an air-bag, inside a steering wheel, on a dashboard, within an armrest, in a control panel, or in any other surface of a vehicle suitable for interaction with on-board electronic devices.

Published German utility model DE 299 07 054 relates to an instrument dashboard, in particular for a motor vehicle, with a support made at least partially of plastic, which includes display instruments and operating components powered by conductive tracks made in electrically conductive plastic (for example, ULTRAFORM® produced by Basf or DURETHAN® and POCAN® produced by Bayer). The conductive tracks may be made in a flat form and may be combined chemically or mechanically with the support (for example, by an injection-moulding process).

Published international patent application WO 2010/026000 describes a single-layer or multiple-layer lining for a vehicle that has regions formed by a mixture of plastic and conductive material. The lining may be used as a part of the interior upholstery of a vehicle (for example, for dashboards or insides of doors). Predetermined areas are provided with conductive tracks for performing electrical conduction functions and more complex switching, sensor, or general signal transmission functions, wherein the tracks are made of a mixture of plastic materials forming the lining and a conductive material (for example, carbon nanotubes).

A method for producing electrically conductive and/or piezo-resistive tracks on a non-conductive, composite, polymeric substrate including a matrix of commercially available polyolefinic thermoplastic polymers, with a dispersed-phase filler of carbonization promoters such as carbon nanofibres or carbon nanotubes is known from the international patent application WO 2012/055934, which teaches how to realize the conductive tracks by laser ablation, wherein consequent localized pyrolysis of the substrate results in the formation of carbonaceous conductive structures favoured by the promoters, which are able to participate in the conduction by concentration in the tracks. However, although the aforementioned document suggests, in theory and in the light of laboratory tests, using such a technology for the formation of electrical connections and simple electrical devices (such as pushbuttons, sensors, antennas, etc.) incorporated in polymeric substrates widely used in motor vehicles, (such as polypropylene and polyethylene), it does not deal with the practical aspect of industrial application of this technology to the manufacture of the aforementioned elements in actual on-board components, nor the integration of the technology with already established techniques for production of these components.

The components in the automotive field which benefit from integration with electrical devices (such as the dashboard or door panels) have particular forms determined by the ergonomic requirements associated with their use, or simply by their position in the passenger compartment. In such cases, their shaped forms are determined by the aesthetic appearance that the designer wishes to give to the passenger compartment of a vehicle, such that it may be distinguished from the design solutions of competitors. Moreover, the industrial technology of injection-moulding in the automotive field known in the art is optimized for processing polymeric compounds commonly used for the production of these components, but is not adapted for processing compounds with a dispersed-phase filler, distribution of the filler affecting the electrical properties of the entire component, and specifically the high electrical conductivity values that can be obtained by selective laser ablation of (bidimensional or tridimensional) regions of the component intended to integrate the designed electrical functions.

It is therefore desirable that the technology for the manufacturing of electrical devices and connections incorporated in non-conductive polymeric substrates should be improved for practical application thereof to specific on-board components of a vehicle and that the current technologies for moulding these components in the automotive field should be adapted to the new materials.

The main factors to be considered during the design of a motor-vehicle component using a polymeric material with a dispersed-phase filler having conductive properties which can be locally activated in a selective manner are dependent on the suitability of the component to form conductive tracks with electrical conductivity properties which can be controlled, depending on the desired design configurations. For this purpose, during the design of a component, the following parameters may be adjusted: the minimum distance between parallel conductive tracks, in order to prevent interference and short-circuits; the curvatures and plane variations of the conductive tracks, in order to avoid the formation of discontinuities therein; the geometrical configuration of the conductive tracks (length and cross-section) depending on the electrical characteristics of the signal, the polymeric material used, and the foreseen electrical load; the geometrical configuration of the component made of polymeric material in the regions designed for an electrical device, in order to define controlled-deformation zones and realize control devices which can be activated by external deformation and pressure stimuli (for example, based on the piezo-resistive effect of the conductive tracks); the geometrical configuration of the conductive tracks in the regions designed for an electrical device, in order to define capacitive proximity sensor zones and form control devices which can be operated by external touching actions (for example, based on the capacitive effect of the conductive tracks); the technical solutions for connecting the component containing the conductive tracks to the on-board power supply and/or signal processing systems.

SUMMARY OF THE INVENTION

The object of the present invention is to provide a component or a shaped structural part made of non-conductive, composite, polymeric material, in particular for installation on-board a vehicle, integrating electrical devices and connections. A further object of the present invention is to produce an electrical device integrated in a component or structural part made of non-conductive, composite, polymeric material, in particular for installation on-board a vehicle, adapted to provide control functions in an on-board electrical circuit. The general aims underlying the invention are also considered to be those of: increasing energy saving in new vehicles; increasing the degree of recyclability of the polymeric components; and reducing the costs of acquisition and assembly of accessory components, in particular switches and wiring. The invention also relates to a component or structural part made of composite polymeric material, particularly for installation on-board a vehicle, integrating a control device for an electrical circuit.

In short, the present invention is based on the technology of manufacturing components or structural parts of a vehicle using non-conductive composite polymeric material, including a polymeric matrix with a nano-structured dispersed-phase filler including filamentary nano-structures, promoters of carbonization for the formation of carbonaceous conductive structures, according to the teachings of WO 2012/055934.

The invention proposes using laser ablation technology for defining, in components or structural parts of a vehicle, conductive circuits that are entirely carbon-based so as to provide conductive tracks integrated in the polymeric material and which form electrical connections or piezo-resistive electrical devices (for example, signal switches integrated in the component) obtained by deformation of predetermined areas of polymeric surfaces containing conductive tracks.

The invention is based on the principle of extending the disturbance region of a conductive track integrated in a component or a structural part made of non-conductive polymeric material, and forming a corresponding area of the component or part with a pressure-deformable structure so as to produce an electrical control device.

BRIEF DESCRIPTION OF THE DRAWINGS

Other objects, features and advantages of the present invention will be readily appreciated as the same becomes better understood after reading the subsequent description taken in connection with the accompanying drawings wherein:

FIG. 4 is a cross-sectional illustration of a process for laser writing a volume of composite polymeric material;

FIGS. 5 and 6 are schematic illustrations, in a plan view and cross-sectioned perspective view, respectively, of a piezo-electric operating device integrated in a substrate of non-conductive polymeric material; and FIG. 7 is an exemplary schematic illustration of the areas of conductivity (conductive tracks) in a composite polymeric material and of corresponding external connection terminals.

DETAILED DESCRIPTION OF THE INVENTION

Figure 1:
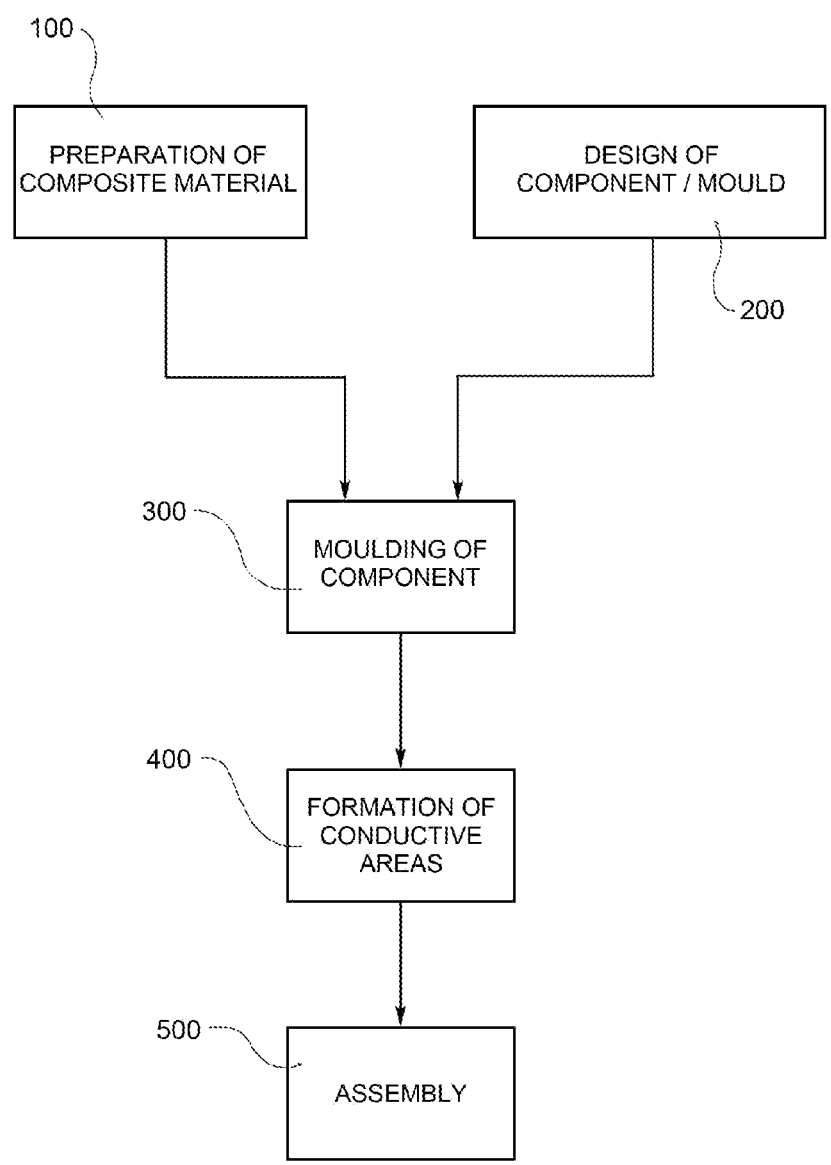
FIG. 1 is a schematic flow diagram illustrating an innovative method for the production of a vehicle component or a structural part made using non-conductive polymeric material and integrating electrical devices or connections.

FIG. 1 shows, in schematic form, the steps of an innovative method for the production of a component or a structural part for a vehicle, made using non-conductive polymeric material and integrating electrical devices or connections. In step 100, the composite polymeric material is provided, the material includes a non-conductive polymeric matrix and a dispersed phase of filamentary nano-structures which are promoters of conductivity. At the same time, in step 200, the design of the component or the structural part of the vehicle and the associated mould for injection-moulding forming of the material produced in step 100 is performed.

The step for forming the component or the structural part is denoted by 300 and, in the following step 400, definition of the conductive areas or tracks is carried out on the moulded part using the laser ablation writing technique described in published international patent application WO 2012/055934.

Finally, in step 500, the component or part produced (which has predetermined conductive areas forming the electrical devices and connections) is assembled together with other supply components, such as the external connectors.

The provision of the composite polymeric material includes mixing, in a polyolefinic polymeric substrate (for example, commercially available polypropylene (PP) or high-density polyethylene (HDPE)) of a phase of filamentary nano-structures, promoters of conductivity, (in particular, carbon-based nano-structures such as carbon nanotubes or nanofibres enriched with substances which favour compatibility) namely coupling agents for the reinforcing fibres (for example, alkaline hydroxides in aqueous solutions of polymer grafted with maleic anhydride) and a phase of reinforcing fillers, such as glass fibres or fillers of mineral origin.

The inventors have noted that the increase in conductivity in the components made using this polymeric material is greater than the conductivity in the components made of composite polymeric material without reinforcing fibres. The reinforcing fibres, especially those with short glass fibres, have the effect of increasing the degree of dispersion of the carbon nano-structures, which otherwise tend to reaccumulate in the melted mass, creating "islands" which overall prevent the transit of electric charges in the manufactured article, owing to the Van der Waals forces generated between the chains of nano-structures. This distribution effect also reduces the so-called skin effect (for example, the formation of a surface film of non-conductive polymeric material), allowing the nanotubes to migrate towards the surface, directed by the reinforcing fibres.

The reinforcing fibres, in particular the glass fibres, are a reinforcing agent which is widely used in the polymer sector. In the tests carried out for optimization of the raw materials to be used in the process described above, it has emerged that in a polyolefin (PP, HDPE) based polymeric matrix, to which carbon nanotubes have been added, the presence of glass fibres (in one embodiment, in filaments with a length of the order of 5 mm and diameter of the order of 10 µm), increases the electrical conductivity thereof (even without further carbonization treatment) and facilitates the dispersion of the carbon nanotubes. The results obtained show that a partially conductive interphase is formed between the glass fibre and the polymeric matrix owing to the carbon nanotubes which tend to line the glass fibre: the local concentration of the carbon nanotubes inside the glass fibre/polymer matrix interphase provides the material with multifunctional properties, including an increase in the mechanical characteristics due to the presence of the glass fibres, and an increase in the electrical characteristics due to the presence of the carbon nanotubes.

The coupling agents used to improve the adhesion of the glass fibres in the polymeric matrix improve the distribution of the fibres in the matrix itself, making it practically isotropic: the nanotubes which line the fibres are consequently also uniformly distributed in the polymeric matrix, thereby ensuring the homogeneity of the electrical conductivity in the article.

Figure 2:
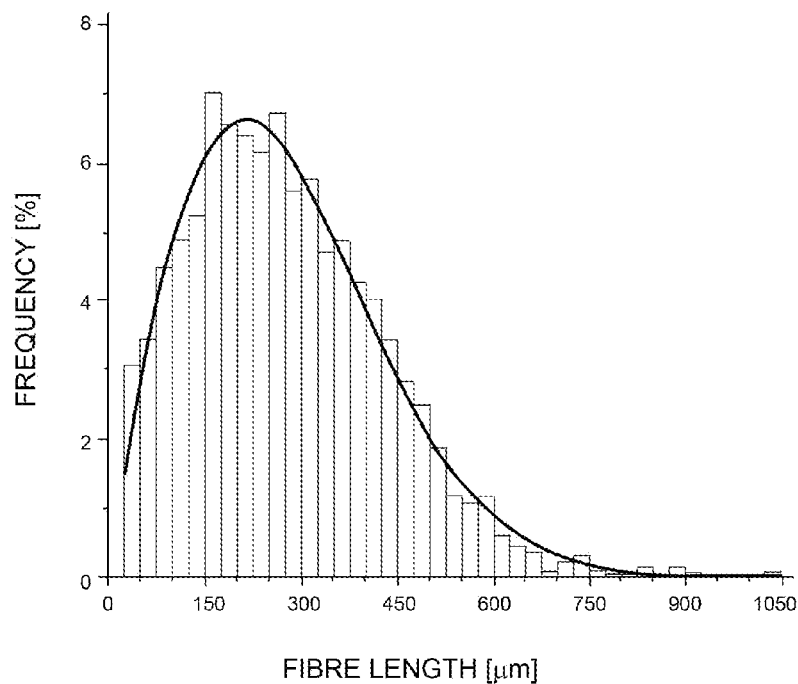
FIG. 2 is a diagram illustrating the characteristic parameters of a step of the innovative method relating to the moulding of a non-conductive polymeric composite material which includes a dispersed phase of filamentary nano-structures, promoters of conductivity, and to which reinforcing fibres have been added.

It has been noted in tests that a component made from polyolefinic materials to which carbon nanotubes have been added, owing to the correct dispersion exerted by the glass fibres, has a conductivity at least 100 times greater than an analogous component without a dispersed glass-fibre phase. These results have been obtained with polyolefin-based polymers including carbon nanotube fillers (multiwall CNT) in an amount from 1.5% to 10% by weight, and glass fibre fillers in an amount from 10% to 20% by weight (values being referred to the weight of the composite material). During the moulding of materials of this type, the flow of the material filling a mould (the dynamic behaviour of which is comparable to that of a high-viscosity fluid) produces complex interactions which result in: a fragmentation, such that the lengths of the fibres are distributed in a manner typical of a Weibull distribution, as shown in FIG. 2; and a strong influence of the dynamic behaviour of the flow on the arrangement of the fibres which arrange with preferential orientations.

Figure 3:
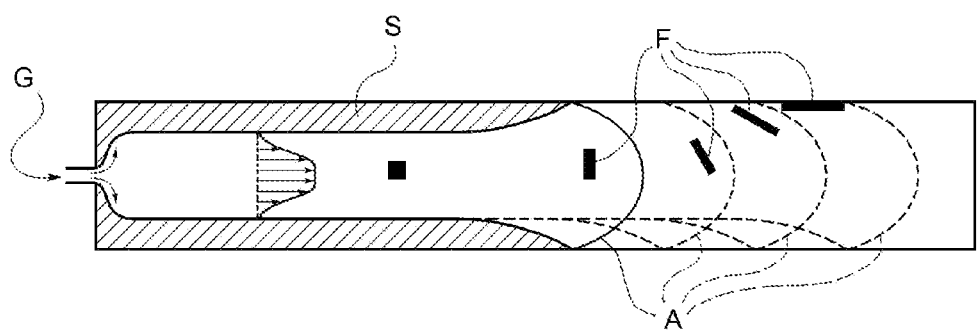
FIG. 3 is a schematic illustration of a step of the innovative method relating to the moulding of a polymeric composite material including a dispersed phase of filamentary nano-structures, promoters of conductivity, to which reinforcing fibres have been added.

In particular, the velocity profile of the flow has a high gradient zone in the vicinity of the mould walls, and a zone with a tendentially uniform profile in the central part of the thickness of the mould cavity. Consequently, in the volumes of material which in the centre are subject mainly to transverse deformation, the fibres tend to be arranged in a direction perpendicular to the injection flow, while in the vicinity of the walls the fibres tend to be arranged parallel to the flow, as a result of the shearing stresses. This condition is shown in FIG. 3 for a generic mould with a tapered shape provided with an injection nozzle, wherein G indicates the injection nozzle, A indicates the advancing front edge of the injected flow, F indicates the arrangement of the fibres, and S indicates the volume of solidified composite material.

The fluid-dynamic conditions created during injection of the composite material mixed therefore define the orientations of the fibres which, in turn, determine the mechanical and electrical properties of the component. Therefore, in view of the foregoing, in order to avoid localized stress of the material during the injection step with an associated loss of the conductive capacities (breakage of nanotubes, deterioration of the matrix, skin effect), during design of the actual mould, particular attention needs to be paid to the following parameters: injection layout, if necessary sequential; mould conditioning layout; and design of the movements of the carriages which are not temperature-regulated.

The component moulding step 300 is therefore dependent on a suitable design of the mould in step 200 which is dependent in turn on the design of the component, not only as regards the form and volume dimensions, but also the arrangement of the conductive regions where the integrated electrical connections or devices are to be formed.

The component is obtained by injection-moulding the polymeric compound defined above. Advantageously, the component or the structural part which is to be made should not have small-radius curvatures. Further, the forming mould should have an optimized spatial distribution of the injection nozzles, which are spatially more concentrated (compact) in the electrically functional areas of the part and spatially more spread out elsewhere.

The moulding conditions (including, for example, temperature profiles, velocity profiles, temperature-regulation mode of the mould, injection times, pressure profiles) fundamentally determine the electrical conductivity characteristics the manufactured article will have after moulding and following definition of the conductive areas or tracks by writing or laser ablation. The correct setting of these moulding-related parameters is of fundamental importance in order to produce a component which has sufficient levels of internal conductivity (for example, of the order of 100 ohm/cm), also before laser activation of the actual conductive areas. Incorrect moulding parameters may cause a partially isolating skin effect, which would hinder the subsequent laser writing activation step.

The optimum definition of the moulding parameters is generally dependent on the geometrical configuration of the component and the layout of the mould, so that for each new component to be moulded, associated polymeric material, press type, and mould layout, it is necessary to follow a specific procedure of fine-tuning the initial parameters and defining the optimum operational parameters. For example, in the case of production of a fuel filler nozzle, a HDPE-based composite material including carbon nanotubes and glass fibres in the percentage amounts indicated above, the tests carried out have revealed the following general setting of the parameters necessary for obtaining a good initial conductivity level: mould temperature-regulated to an average temperature of 60° C.; high injection speed; low holding pressure; and high holding time.

In particular, from the tests carried out it emerges that the distribution of the glass fibres, and therefore the distribution of the carbon nanotubes (namely the nano-structures which promote conductivity), and consequently the homogeneity of the electrical characteristics of the moulded article, are affected by the following transformation parameters: melting temperature, mould temperature, cooling time, injection speed and time, injection pressure, plasticization speed, holding time, and pressure.

The tests carried out for components with a volume of about 300 cm3, such as the fuel filler nozzle, show how it is advantageous to operate using the following moulding parameters: temperature of the material between 190° C. and 260° C.; temperature-regulation of the mould between 50° C. and 70° C.; injection speed of between about 60 cm3/s and 150 cm3/s (or an injection time of between 3 s and 5 s for a volume of 300 cm3); injection pressure of between 60 bar and 80 bar; holding/cooling time in the mould of between 30 s and 60 s; holding pressure of between 35 bar and 60 bar.

It is noted that, with the polymeric materials to which carbon nanotube and glass fibre fillers have been added, there is a variable dispersion of the the fillers depending on the radial distance from the injection point. In effect, the carbon nanotubes act as a fluidifying agent for the polymer chains. Having a smaller size, the hot molecules of polymers "slide" on the nanotubes. This effect results, with regard to the part, in a high concentration of nanotubes close to the injection point, and a smaller concentration of nanotubes far from the injection point. For this reason, in order to ensure that a functional component is obtained, namely one where it is possible to form conductive tracks able to form electrical connections or devices, it is advantageous to arrange the injection zones close to the electrically functional areas of the part, namely the areas of the component or structural part which are to be used for formation of electrical connections or devices. For example, in the case where it is required to form areas with piezo-resistive characteristics (adapted to the formation of switching devices, such as the control buttons for apparatus on-board a vehicle), it has been established that the arrangement of the injection nozzles needs to be within a radius of 30 cm from the area assigned to undergo a subsequent laser writing treatment for activation of conductive tracks. Greater distances do not ensure an adequate distribution of the glass fibres and the carbon filamentary nano-structures, irrespective of the moulding parameters envisaged.

Once the mould has been prepared, following the design of the component or structural part adapted to integrate electrical devices or connections, and after implementation of the industrial process for moulding this component or structural part, the step for definition and realization of the conductive areas (tracks) is performed. For this purpose the technique of writing by laser ablation and consequent localized pyrolysis known from international patent application WO 2012/055934 is applied.

It has been shown that the localized heating produced by a focused laser beam (which induces selective superficial ablation of the polymer matrix) causes the filamentary nano-structures, which are dispersed within the matrix, to surface and percolate, thus forming a conductive pattern. Moreover, the interaction of the laser beam with the polymer substrate favours the thermal decomposition thereof, and the consequent formation of carbon. The carbon formed in this way acts as a bridge between the nano-structures during the process of ablation of the surface layers, further favouring the formation of the electrically conductive areas (tracks). A laser beam precisely focused on the polymer matrix may be used to obtain deep and stable conductive tracks.

The parameter for the minimum distance between the conductive tracks needs to be controlled in order to prevent interference (crosstalk) between adjacent tracks. For this purpose, it has been noted that in a polypropylene matrix with a mineral reinforcing filler (for example, talc) in an amount of 10% by weight (referred to the weight of the composite material), in order to improve the dimensional stability and the rigidity (including rubber, if necessary, for improving the impact elasticity), and carbon nanotube filler in an amount of 2.5% by weight referred to the weight of the composite material, which ensures an electrical conductivity of 1.6 Kohm/cm. In order that there be no interference between the tracks, a minimum distance of 10 mm needs to be maintained between adjacent tracks.

The width and depth parameter of the laser beam for ablation of the composite material needs to be controlled so as to obtain a level of specific electrical resistivity of at least 1.6 Kohm/cm on an injection-moulded component with an average thickness of between 2.5 mm and 3.0 mm.

FIG. 4 shows a cross-sectional view of a laser-cut track. From test results known to the inventors, in order to obtain a level of electrical conductivity of at least 1.6 Kohm/cm, it is necessary to perform a laser incision with a width which is preferably between 1.10 mm and 1.40 mm, ideally equal to 1.25 mm, and a depth preferably between 0.70 mm and 0.90 mm, ideally equal to 0.80 mm. The focused laser incision forms a groove B in the surface C of the material with an overall triangular and substantially symmetrical cross-section, but other forms, for example a trapezoidal form, and different orientations may be obtained by controlling focusing and orientation of the laser beam with respect to the surface of the part.

The inventors have noted that, with a laser beam which has a wavelength of 10.6 μm, the optimum speed of laser ablation is 5 mm/min with an effective focal length of 135 mm and an operating power of about 30 W. In order to avoid localized combustion, which results in deterioration of the nanotubes, the laser ablation process is carried out in an inert nitrogen atmosphere.

It should be noted that a thermally modified zone Z (with transverse dimensions of about 0.2 mm), where an electrical conductivity effect may be detected, is created in the neighbourhood of the groove.

In order to form electrical connections and devices, the geometrical configuration of the conductive tracks, namely the layout of the conductive region, its width and depth, need to be controlled. This is of fundamental importance in the realization of electrical devices such as switching devices in the form of control buttons integrated in the component to usefully employ the piezo-resistive effect of a conductive track (namely, the variation in resistance caused by a suitable mechanical deformation) or the capacitive effect of a conductive track (namely, the variation in capacity caused by an external body (finger) touching a conductive electrode area).

The thermally modified zone Z, which represents the active carbonization area, is conveniently situated entirely on the same side with respect to the neutral plane of the substrate of the device subjected to mechanical deformation (neutral axis N in FIG. 4 showing a cross section of the device), preferably without crossing it, in such a way that the active carbonization area is subjected entirely to the same type of deformation (compression or tension). In the part where the thermally modified zone Z is formed, the material conveniently has to allow for percentage deformations of the filamentary nano-structures (under compression or tension) of between 1.0% and 3.0%.

FIGS. 5 and 6 show two schematic illustrations of a control device (button) integrated in a component using the technology described in this patent application, respectively in a plan view from above, showing the forms and dimensions thereof, and a partial view simulating the movement of the device in an operating condition.

FIG. 5 shows a segment 10 of a conductive track embedded in a matrix of polymeric material 12 or substrate, in which an operating area 14, able to be acted on by a user, is defined. In one embodiment, an operating area with a circular form, the diameter of which is between 20 mm and 30 mm and ideally 25 mm, defined along a winding section 10' of the conductive track 10, having a loop-like or meander form, the width of which is between 1.0 mm and 2.0 mm and ideally equal to 1.5 mm. It should be understood that the illustration of a substantially bell-shaped loop is purely indicative and that other winding trajectories may also be provided in the operating area 14. Advantageously, the greater the overall length of the conductive track subject to stressing and subsequent deformation of the filamentary nano-structures in the operating area (in this case following a pressure exerted on the area by a user) the greater the effect of variation of the electrical resistivity parameter indicating the action of a user performed on the operating device.

A cut or weakening line 20 (for example, a thinner zone of the material) is conveniently provided on the polymer substrate around the operating area in order to facilitate the mechanical displacement (oscillation) of at least one portion of the operating area of the device with respect to the surrounding surface of the component in which it is integrated, and amplify as far as possible the effect of varying the electrical parameter of the circuit. FIG. 5 shows an open cut line 20 substantially in the form of cardioid. This cut line defines a base of the operating area 14 (the area between the end segments E of the cut line and the circumferential arc F without the cut line) having a substantially trapezoidal form, which allows the device to operate in the elastic range without undergoing permanent deformation.

FIG. 6 shows a partial, simulated, three-dimensional view of the device obtained by sectioning the device area along the diametral cross-sectional line VI-VI shown in FIG. 5. It is possible to identify a top surface portion 22a (which is subject to a tractional force in the operating condition where pressure is exerted on the area of the device) and a bottom surface portion 22b (which is subject to compression in the operating condition where pressure is exerted on the area of the device). During tests, the piezo-resistive effect occurred when a force of 25 N was applied with an elastic deformation of about 3 mm. A corresponding variation in the electrical resistivity between the ends of the winding segment 10' of the conductive track equivalent to 10% was recorded. Where no force is applied, the resistance is equal to R=30 Kohm. Where a force of F=25 N is applied, the resistance is equal to R=33 Kohm.

The minimum variation in electrical resistivity which can be detected over a background noise, resulting from variations in the environmental conditions is in the region of 3% (for example, temperature or humidity, which also produce dimensional variations in the component).

In general, it was shown that, in order for the formed operating device to be able to work in the elastic range, the maximum permissible deformation should be equal to about 3 mm. Moreover, in order to obtain the piezo-resistive effect with the aforementioned characteristics, the operating area 14 should have a thickness greater than 2 mm and a thickness of 3 mm. In the particular case of a "bell-like" winding section, shown in FIG. 5, this includes, within the perimeter of the operating area 14, for the most part sections of trajectory which have a predominant component oriented in the plane of deformation (bending) of the structure (conveniently at least 70% of the total length of the winding section), and are thus subjected to a greater stressing differential, for which reason the filamentary nano-structures experience the maximum deformation, and only minimally (at the top of the bell) a substantially equitensional section of trajectory. This type of curve has the greater variation in resistivity with respect to the length of the winding section.

The component or structural part realized by applying the process steps described above and integrating electrical devices or connections is assembled together with other components forming part of a supply set (for example, by successive mechanical processing operations, such as welding, gluing, able to integrate the selectively conductive component in a supply assembly for subsequent installation on the vehicle). To this end, advantageously, the component or the structural part has a plurality of metal connection terminals co-moulded on the polymeric matrix which allow the connection of the conductive tracks and the control devices to electrical circuits or systems outside the component, in order to receive or distribute information or power supply current signals.

FIG. 7 shows a panel of polymeric material, denoted overall by 50, containing conductive tracks 52 which may be parallel to each other and spaced so as not to cause crosstalk or interference between adjacent connections, wherein the tracks have, coupled to their ends along the edge of the panel, metal (for example gold) connection terminals 54 for connection to external electrical (signal or power supply) distribution circuits, such as wiring of on-board equipment for receiving operating commands from the control devices (buttons) integrated in the polymeric matrix.

It should be noted that the embodiment proposed for the present invention in the above description is intended to be a purely non-limiting example of the present invention. A person skilled in the art may easily implement the present invention in different embodiments which do not depart from the principles illustrated here and are therefore included in the present patent, as defined in the appended claims.

The present invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

What is claimed is:

1. A control device for an electrical circuit integrated on a substrate made of polymeric material, incorporating carbonaceous conductive structures which define at least one track having improved electrical conductivity properties with respect to the substrate, which control device includes an operating area able to be acted on by a user and having a pressure-deformable structure adapted to disturb the electrical properties of said integrated track by a piezo-resistive effect, wherein said integrated conductive track includes at least one linear segment which has a winding progression at said operating area, wherein said integrated conductive track includes a thermally modified zone, where an electrical conductivity effect may occur, and which is arranged entirely on a same side with respect to a neutral plane of the operating area of the device, and wherein said integrated conductive track includes at least one linear segment having a winding progression at said operating area, and which includes for the most part sections of trajectory having a predominant component oriented in a plane of deformation of the operating area, which are subjected to a stressing differential such that said conductive structures experience deformation which causes a variation in electrical resistivity.

2. The control device as set forth in claim 1, wherein, in the part in which the thermally modified zone is formed, said substrate has filamentary nano-structures adapted to withstand bending percentage deformations of between 1.0% and 3.0%.

3. The control device as set forth in claim 1, wherein a length of the sections of trajectory having a predominant component oriented in the plane of deformation of the operating area is at least 70% of a total length of said winding progression.

4. The control device as set forth in claim 1, wherein said winding segment defines at least one loop at said operating area, such that an overall length of the segment, subject to disturbance of the electrical properties at the operating area following a pressure exerted on said area, is adapted to bring about a variation in an electrical resistivity electrical parameter of said integrated conductive track between ends of the winding segment of at least 3%.

5. The control device as set forth in claim 1, including a cut or weakening line of the substrate around said operating area, which is adapted to permit a displacement of at least one portion of the operating area of the device with respect to a surrounding portion of the substrate.

6. The control device as set forth in claim 1, wherein said conductive track has, at at least one end located at an edge of the substrate, metallic electrical connection terminals co-moulded with said polymeric material for connection to external signal distribution circuits.

7. The control device as set forth in claim 1, wherein said operating area has a circular form, a diameter of which is between 20 mm and 30 mm, and said conductive track has a width of between 1.0 mm and 2.0 mm.

8. The control device as set forth in claim 1, including a component or structural part made of composite polymeric material integrating a control device for an electrical circuit.

* * * * *